(12) United States Patent
Nordin et al.

(10) Patent No.: US 9,159,472 B2
(45) Date of Patent: Oct. 13, 2015

(54) TWINAX CABLE DESIGN FOR IMPROVED ELECTRICAL PERFORMANCE

(75) Inventors: Ronald A. Nordin, Naperville, IL (US); Masud Bolouri-Saransar, Orland Park, IL (US); Paul W. Wachtel, Arlington Heights, IL (US)

(73) Assignee: Pandult Corp., Tinley Park, IL (US)

( * ) Notice: Subject to any disclaimer, the term of this patent is extended or adjusted under 35 U.S.C. 154(b) by 545 days.

(21) Appl. No.: 13/310,250

(22) Filed: Dec. 2, 2011

(65) Prior Publication Data

US 2012/0145429 A1 Jun. 14, 2012

Related U.S. Application Data

(60) Provisional application No. 61/420,833, filed on Dec. 8, 2010.

(51) Int. Cl.
*H01B 7/17* (2006.01)
*H01B 11/20* (2006.01)

(52) U.S. Cl.
CPC .................... *H01B 11/203* (2013.01)

(58) Field of Classification Search
USPC ..................... 174/117 F, 36, 106 R
See application file for complete search history.

(56) References Cited

U.S. PATENT DOCUMENTS

| | | | |
|---|---|---|---|
| 4,973,794 A | 11/1990 | Steele | |
| 5,329,064 A * | 7/1994 | Tash et al. | 174/36 |
| 5,434,354 A * | 7/1995 | Baker et al. | 174/36 |
| 5,483,020 A | 1/1996 | Hardie et al. | |
| 6,452,107 B1 * | 9/2002 | Kebabjian | 174/113 R |
| 6,677,534 B2 | 1/2004 | Yamamoto et al. | |
| 6,849,799 B2 | 2/2005 | Springer et al. | |
| 7,479,601 B1 | 1/2009 | Cases et al. | |
| 7,525,045 B2 | 4/2009 | Archambeault et al. | |
| 7,531,749 B2 | 5/2009 | Archambeault et al. | |
| 7,649,142 B2 | 1/2010 | Archambeault et al. | |
| 2009/0229850 A1 | 9/2009 | Cases et al. | |
| 2011/0083877 A1* | 4/2011 | Sugiyama et al. | 174/115 |

OTHER PUBLICATIONS

"Full-Wave, TwinAx, Differential Cable Modeling", Electronic Components and Technology Conference; 2008; 6 pages.

* cited by examiner

*Primary Examiner* — Chau N Nguyen
(74) *Attorney, Agent, or Firm* — Christopher S. Clancy; Christopher K. Marlow

(57) ABSTRACT

A twinax cable is described. The twinax cable has at least one twinax wire pair with a first shield tape wrapped around it and then surrounded by a second shield tape wrapped around the twinax wire pair and the first shield tape. The shield tapes are wrapped such that the metallic sides of the tape face and make contact with each other.

9 Claims, 22 Drawing Sheets

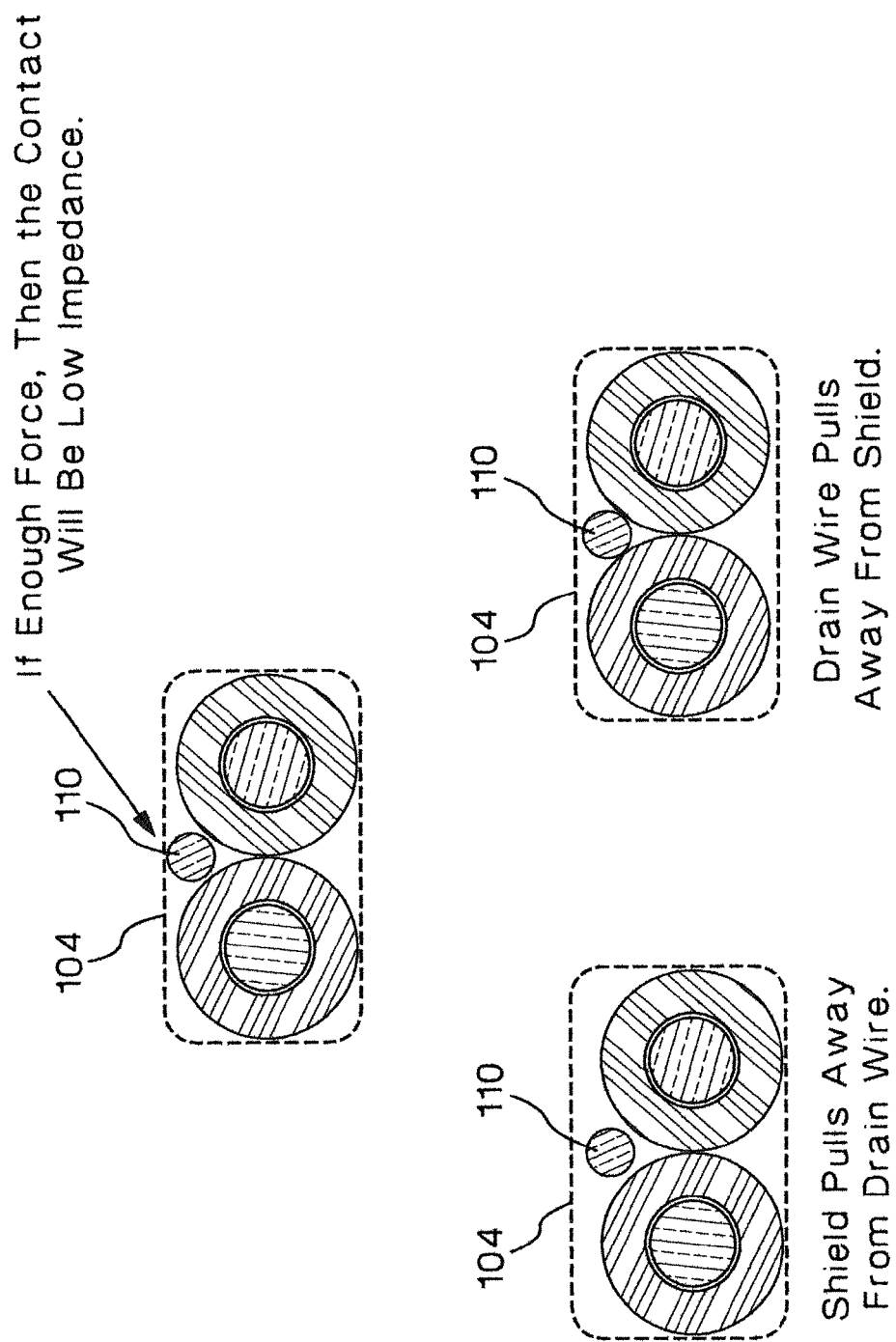

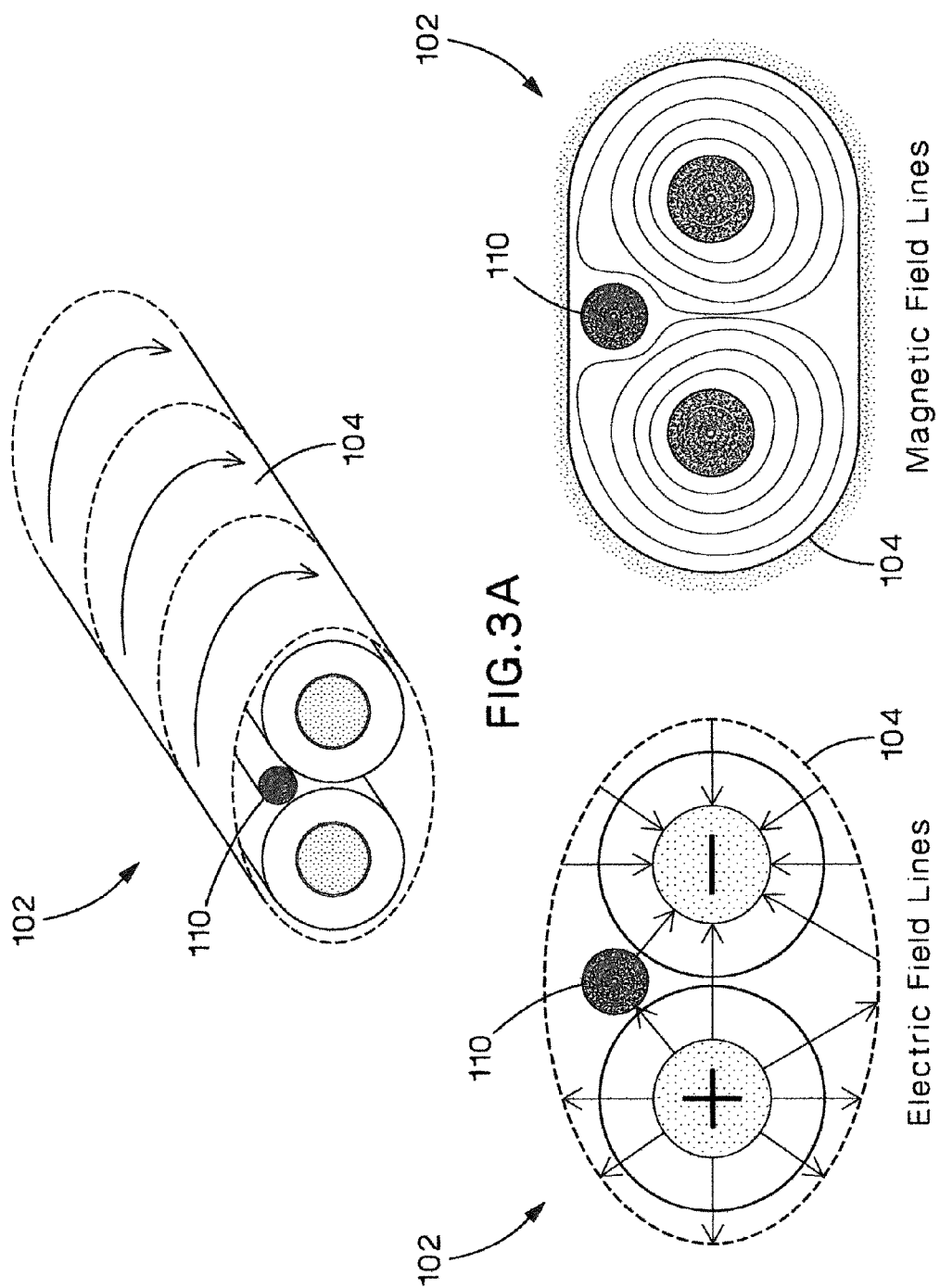

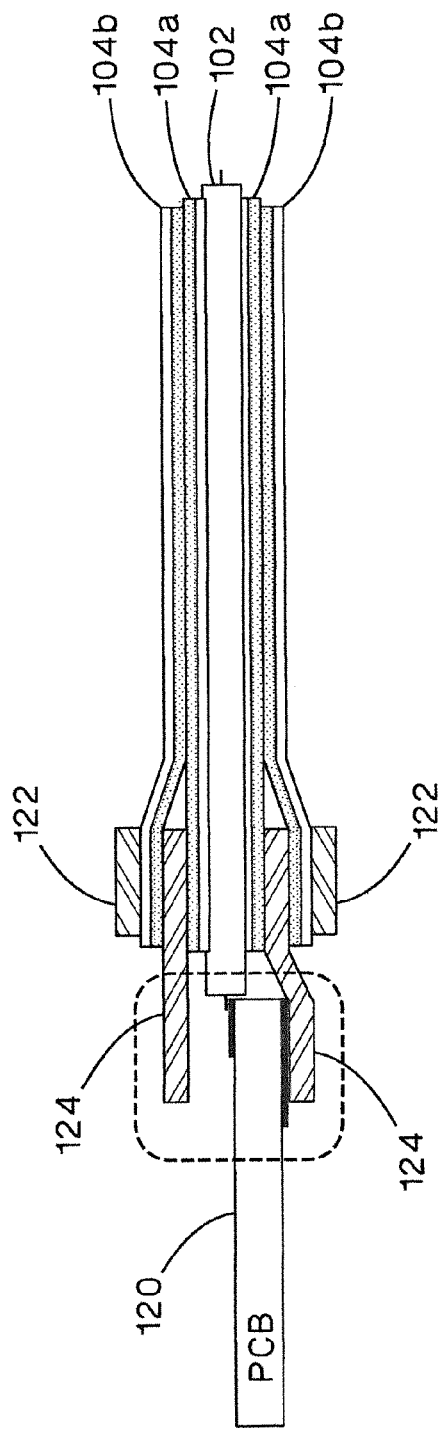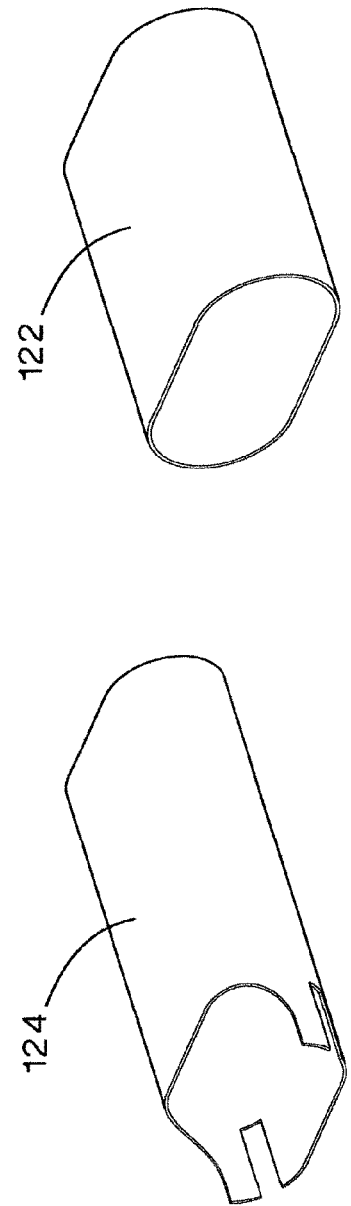

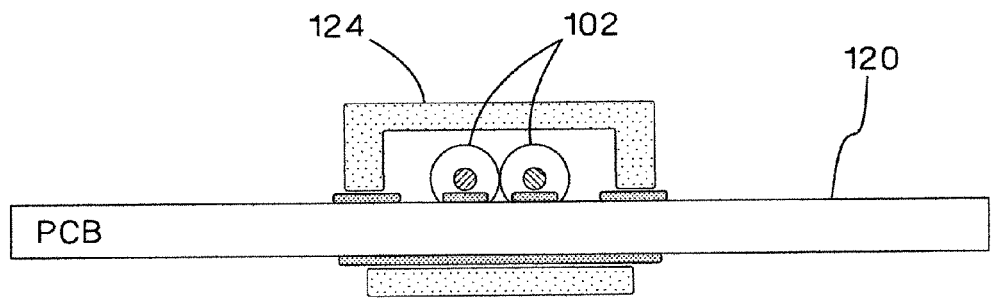
FIG. 7H
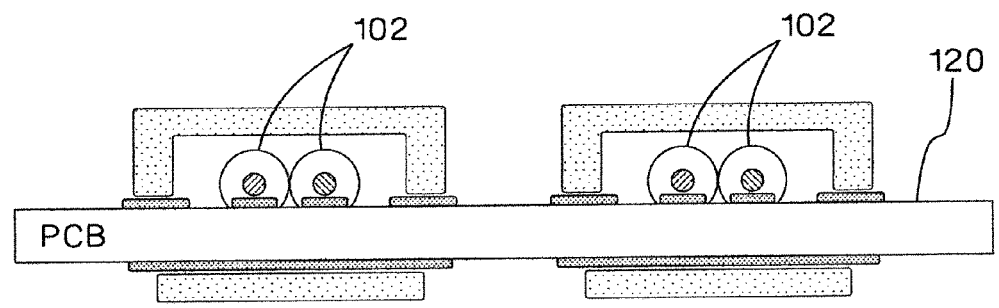
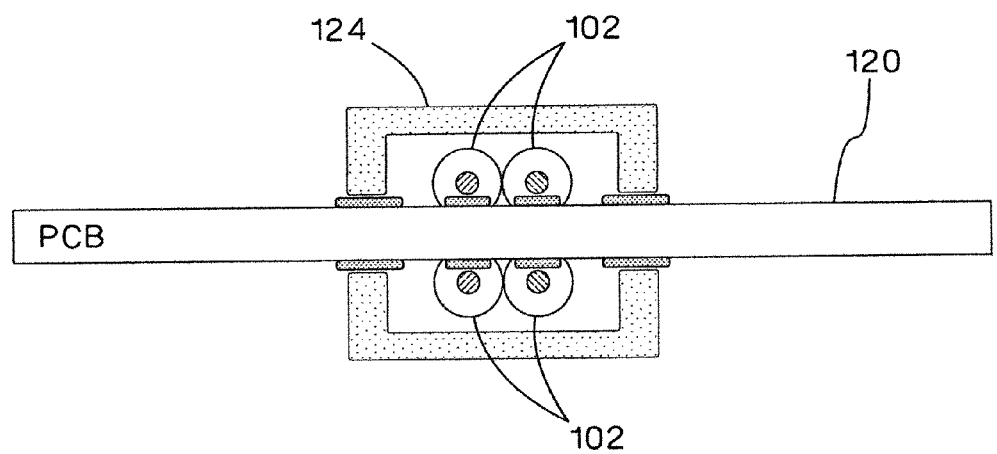
FIG. 7I

TWINAX CABLE DESIGN FOR IMPROVED ELECTRICAL PERFORMANCE

CROSS REFERENCE TO RELATED APPLICATIONS

This application claims priority to U.S. Provisional Application No. 61/420,833, filed Dec. 8, 2010 and entitled "TWINAX CABLE DESIGN FOR IMPROVED ELECTRICAL PERFORMANCE", the subject matter of which is incorporated by reference in its entirety.

FIELD OF THE INVENTION

The present invention relates to twinax cables with improved electrical performance.

BACKGROUND OF THE INVENTION

The network communications industry has selected the use of twinax wire-pair cable assemblies for the transport of high data rate information. One of the challenges of a twinax wire-pair is that the shield tape that surrounds the twinax wire-pair can interact with the wire-pair in a destructive fashion, producing large resonant spikes (in its transfer function response) that can restrict its intended bandwidth and not support the intended application.

For applications requiring a high data rate with low latency performance such as in Storage Area Networks (e.g., Fiber Channel over Ethernet) and High Performance Computing (e.g., Infiniband), the copper media selected for connectivity must have a very high bandwidth capacity, such as with twinax cable, to support the un-modulated baseband signal. To obtain low latency while having low power dissipation, baseband digital communication is typically used instead of a complex modulation scheme requiring sophisticated coding techniques. A drawback is media analog bandwidth. For example, in order to support 10 Gbps (Gigabit/sec) data communication; the media must support at least 5 GHz (typically around 7 GHz) of analog bandwidth. The twinax cable industry has demonstrated that twinax cable can support this data rate and even beyond these data rates (see references to single data rate Infiniband and double data rate Infiniband). In order to achieve these bandwidths, the cable design is refined to address performance parameters in this high frequency range.

For example, to minimize insertion loss, the copper wire surface must be exceptionally smooth (to reduce surface roughness loss), it should be plated with silver (to enhance the smoothness via plating and reduce corrosion; silver also has a conductivity higher than copper), and the wire dielectric must have very low loss (i.e., low dielectric loss or loss tangent). The shield tape plays a critical role in the electro-magnetic wave characteristic that the wire-pair forms. Additionally, there are a number of cable applications that utilize twinax wire-pairs. SFP+ cable utilizes two twinax wire-pairs in its construction (called a one-lane media (where a lane refers to a transmit pair and a receive pair) and also called CX1 standing for "copper times 1 lane"). 40 Gbps Ethernet cable utilizes 8 twinax wire-pairs (CX4) and 100 Gbps Ethernet cable utilizes 20 such twinax wire-pairs (CX10) in its cable construction.

FIGS. 1A-1B illustrate the twinax cable construction for a typical SFP+ CX1 application. FIG. 1A shows a perspective view of a SFP+ cable 100 and 1B shows a cross-sectional view of the cable 100. Each of the two twinax wire-pairs 102 is shielded with a shield tape 104 that is either spirally or longitudinally wrapped about it. A shield tape 104 generally includes a thin sheet of aluminum metal (approximately 1 mil thick) laminated upon an insulating substrate (e.g., polyethylene plastic). (Spiral wrapping is generally preferred due to its superior mechanical properties.) For electrical properties like return loss, it is important to keep the shield in close proximity to the wire-pair 102 as well as keeping the wire-pair 102 together, especially during bending and normal handling of the wire-pair 102. A disadvantage of the spiral wrapped shield is that a resonance can occur. A longitudinally wrapped shield over the twinax wire-pair is preferred from an electrical (differential mode propagation) standpoint because this resonance does not occur but a cable with a longitudinally wrapped shield has poorer mechanical properties, such as separation of pairs during bending resulting in a change of impedance and higher return loss. From a common mode propagation viewpoint, the longitudinally wrapped twinax cable has a lower attenuation which can be problematic due to mode conversion within the cable or within the connector. In the choice between longitudinal or spiral wrap of the shield tape one must consider multiple cabling parameters. The twinax cable assembly 100 (including two of these shielded twinax wire-pairs) is then further shielded with both a shield tape 106 and a wire braid 108. The shields have two different purposes, one is for a signal ground and the other is for a safety ground. The twinax wire-pair shield 104 is used for the signal ground and the outer shield 106, 108 is used for the safety ground. The twinax wire-pair shield tape 104 wraps about a drain wire 110 which should, but doesn't always, have good conductivity to the shield tape 104. The drain wire 110 is used to bridge the signal ground from the cable into the connector signal ground plane.

FIG. 2A illustrates a wire-pair 102 of a twinax cable whose shield 104 is spirally wrapped. FIG. 2B shows a cross-sectional view of the SFP+ CX1 cable 100. The main purpose of the drain wire 110 is to connect the shield ground of the cable to the signal ground of the connector. Since an appreciable amount of the signal is contained (coupled to and propagated within) on the shield 104, how the shield 104 terminates onto the connector is critical to the signal integrity, hence the importance of the high frequency low impedance connection between the drain wire 110 and the shield 104. FIG. 2C illustrates the drain wire 110 to shield 104 contact problems that can occur in a twinax cable 100. When a high frequency low impedance connection is not made (lower views in FIG. 2C), the return loss is increased which can lower the performance of the cable 100.

FIGS. 3A-3C describes the electro-magnetic (EM) field lines that form in a twinax cable wire-pair 102 as well as how the current within the shield 104 travels. In FIG. 3A, the shield 104 is spirally wrapped tightly around the wire-pair 102 and drain wire 110. The shield tape 104 is tightly wrapped around the wire-pair 102 and the drain wire 110 in order to consistently keep the wire-pair 102 together in order to maintain the characteristic impedance (and get good return loss performance) and provide a low resistive contact between the drain wire 110 and the shield 104. FIGS. 3B and 3C show the electric and magnetic field lines within the twinax cable wire-pair 102. The problem is that the shield current does not exclusively follow the EM wave that is traveling longitudinally down the cable. Portions of the energy follow the shield tape 104 in a spiral path and portions will follow the EM field longitudinally (through capacitive coupling within the overlap region). The portion of the signal that follows a spiral path creates a resonance at a frequency corresponding to the overlap periodicity. For example, if the distance between the overlaps is of length 7 mm (and is periodic) the resonant frequency has a fundamental frequency of 28.6 GHz and has second and third harmonics of 14.3 and 7.15 GHz. The resonance that occurs near 7.15 GHz dramatically increases the attenuation of a twinax cable in the vicinity of this resonant frequency. The frequency range where the attenuation is generally effected is from a frequency of 5 times lower frequency than the resonance (hence 1.4 GHz and higher).

FIG. 4 shows that for a longitudinally applied shield (FIG. 4A), the current in the shield travels in the longitudinal path along with the EM wave formed between the conductors. This results in an insertion loss transfer function that performs well as shown in FIG. 4C, although it also includes the aforementioned mechanical and common mode problems. The spirally wrapped shield shown in FIG. 4B can perform poorly as shown in FIG. 4D, with a resonance peak frequency that is proportional to the shield tape overlap to overlap distances.

What is needed in the art is a twinax cable including spirally wrapped shields around respective wire-pairs with an improved attenuation spectrum, and possibly other improved electrical and mechanical characteristics which may increase the useable length of the cable in a number of applications.

SUMMARY OF THE INVENTION

A twinax cable is described. The twinax cable has at least one twinax wire pair with a first shield tape wrapped around it and then surrounded by a second shield tape wrapped around the twinax wire pair and the first shield tape. The shield tapes are wrapped such that the metallic sides of the tape face and make contact with each other.

In some embodiments the two shield tapes may be wrapped in alternate directions. The second shield tape may be the same size, larger, or smaller than the first shield tape.

In some embodiments the wire pair can include a drain wire. The drain wire may be located to the side of the wire pair or may be spirally wrapped around the wire pair. In some embodiments the drain wire may even be stranded wire.

In some embodiments, a second twinax wire pair may be included and wrapped with two shield tapes in a similar manner as the first wire pair.

BRIEF DESCRIPTION OF FIGURES

FIG. 2C are transverse cross-sectional views of twinax wire-pairs illustrating examples of problems in twinax cables that can cause poor wire to shield contact.

FIG. 3A is a perspective view of a spirally wrapped twinax wire-pair demonstrating how current flows in the wire shield.

FIG. 3B is a transverse axial cross-sectional view of a twinax wire-pair illustrating the electric field between the two wires.

FIG. 3C is a transverse axial cross-sectional view of a twinax wire-pair illustrating the magnetic field between the two wires.

FIG. 7A is a longitudinal cross-sectional view of a twinax cable wire-pair and connector interface.

FIG. 7B is a perspective view of an embodiment of an inner crimp ferrule.

FIG. 7C is a perspective view of an embodiment of an outer crimp ferrule.

FIG. 7H is a transverse cross-sectional view of the twinax cable and connector interface of FIG. 7A.

FIG. 7I shows two transverse cross-sectional views of an interface of two twinax cable wire-pairs to a single connector.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE PREFERRED EMBODIMENTS

FIG. 5 shows a longitudinal cross-sectional view of a portion of a shield tape's overlap region (A). The shield tape's longitudinal impedance has essentially two components; a spiral resistive/inductive component and a capacitive component that arises from the tape's overlap region. The overlap capacitance is controlled by the substrate thickness and the overlap width and length. In order to decrease the shield resonance magnitude and/or to increase the resonant frequency, some methods can be applied. In order to shift the resonant frequency up to higher frequencies, the over-lap to over-lap distance can be decreased. This is accomplished by having more wraps per unit length. To decrease the magnitude of the resonant spike, the overlap capacitance can be increased. One simple method of raising the capacitance (and hence lowering the impedance) is to decrease the tape's substrate thickness and/or increase the overlap length (as shown in FIG. 5A). Raising the capacitance lowers the longitudinal impedance and increases the amount of current that follows the EM wave longitudinally down the cable. Another technique is to use double metallic sided shield tape (metal on both sides of a substrate), which increases the capacitance as well. Another way of decreasing the magnitude of the shield resonance peak is to break up and/or alter the periodicity of the overlap regions (and hence reduce the in-phase constructive interference terms). In FIG. 5B, a constant overlap to overlap periodicity is shown (where at each of the overlap regions a reflection occurs that constructively interfere with each other at the cables endpoints and form a resonant response), in FIG. 5C a random overlap length as a function of longitudinal length is shown (which will break up the constructively adding interference waves, thereby reducing and broadening the resonant peak) and FIG. 5D shows a sinusoidal varying overlap length. In C or D, the length between overlap to overlap periodicity is varied and the resonant peak is decreased accordingly. One way to implement a random or periodic overlap is to modulate (or dither) the tape application mechanism either longitudinally or tangential to the cable. Another way to implement either a random or any periodic pattern to produce a longitudinally varying overlap is to use a metallic shield tape whose width has the random width or periodic width.

Figure 1A:
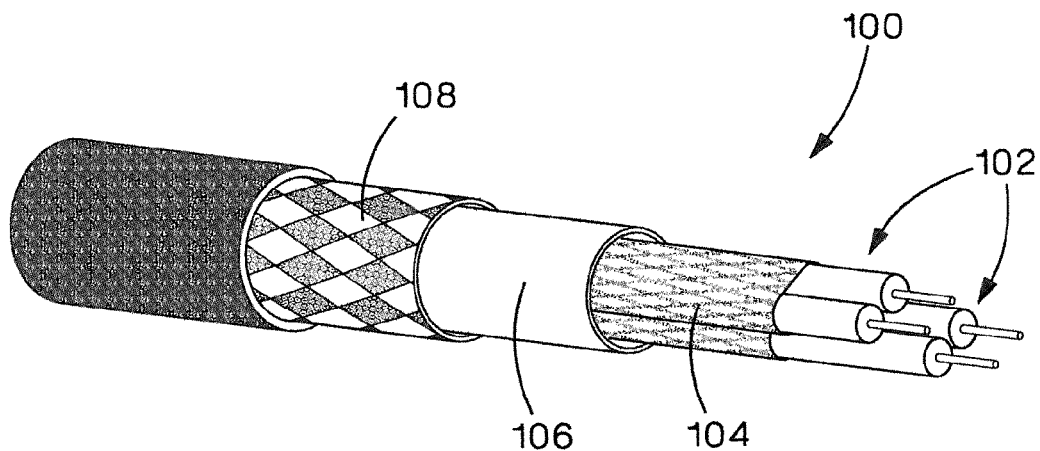
FIG. 1A is a perspective view of a two-pair twinax cable.
Figure 1B:
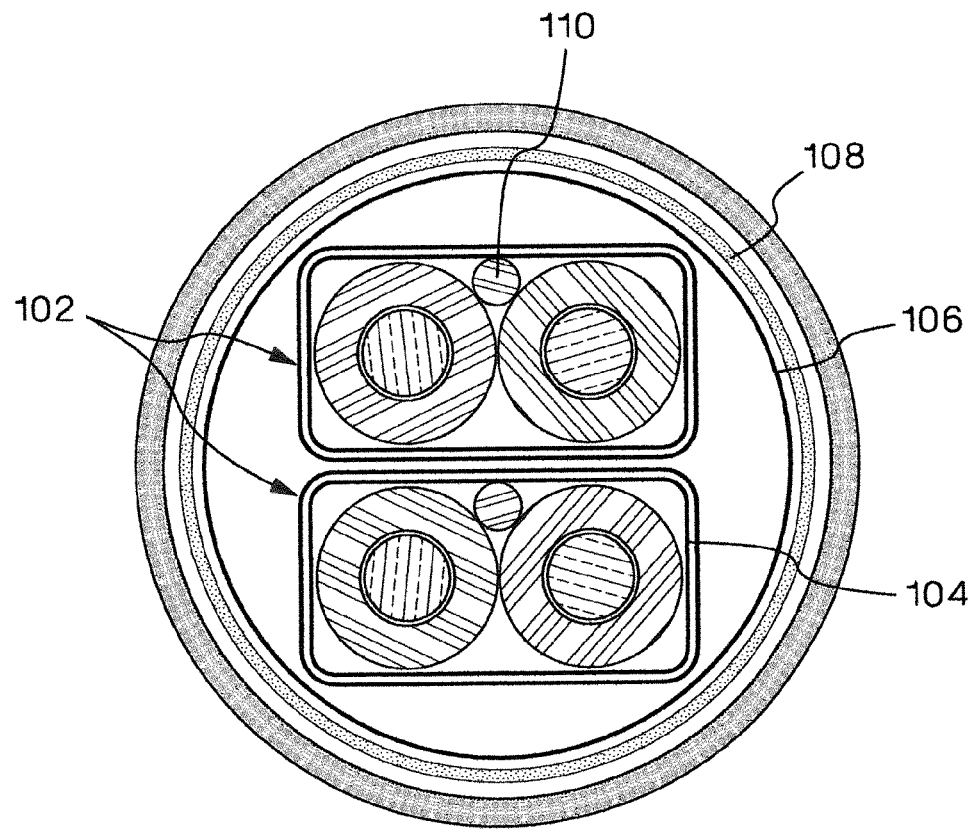
FIG. 1B is a cross-sectional view of the twinax cable of FIG. 1A.
Figure 2A:
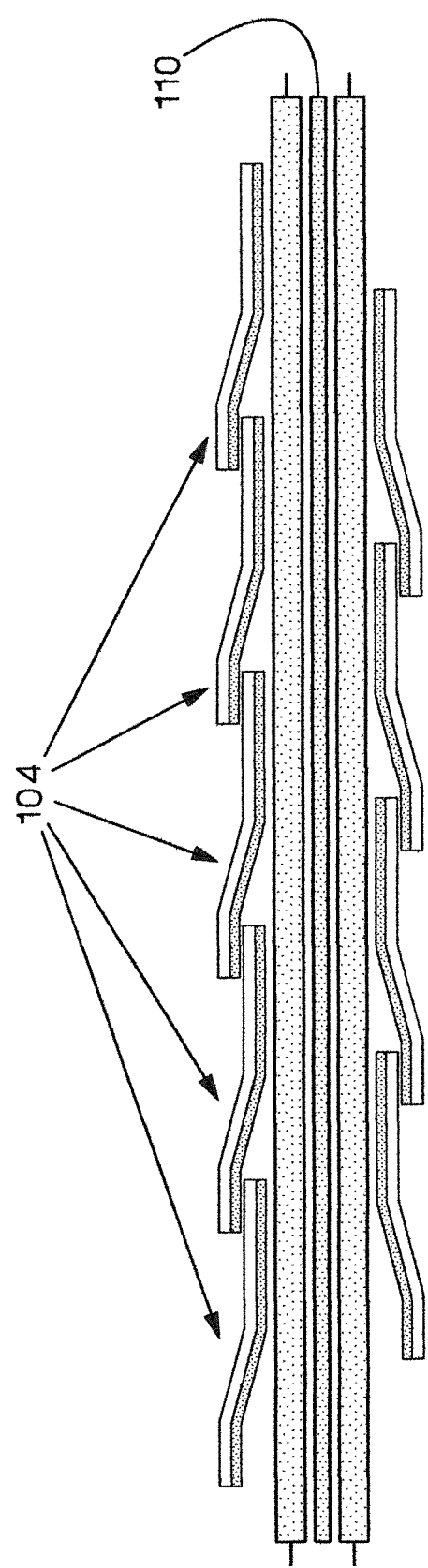
FIG. 2A is a longitudinal cross-sectional view of a twinax wire-pair with a spirally wrapped shield.
Figure 2B:
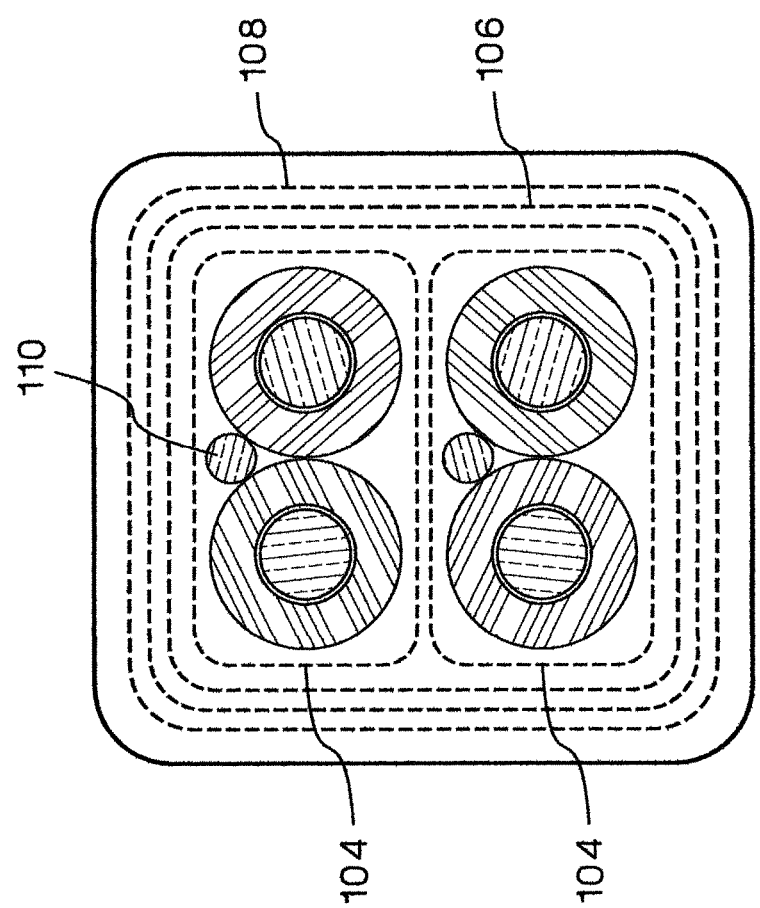
FIG. 2B is a transverse cross-sectional view of a typical SFP+ cable with twinax wire-pairs.
Figure 4A:
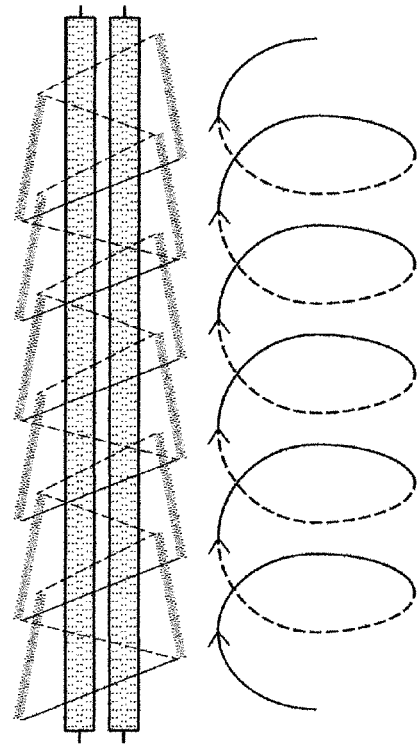
FIGS. 4A-D are schematic views and respective insertion loss graphs demonstrating the difference in wire-pair insertion loss between a longitudinaly applied shield and a spirally wrapped shield.
Figure 4B:
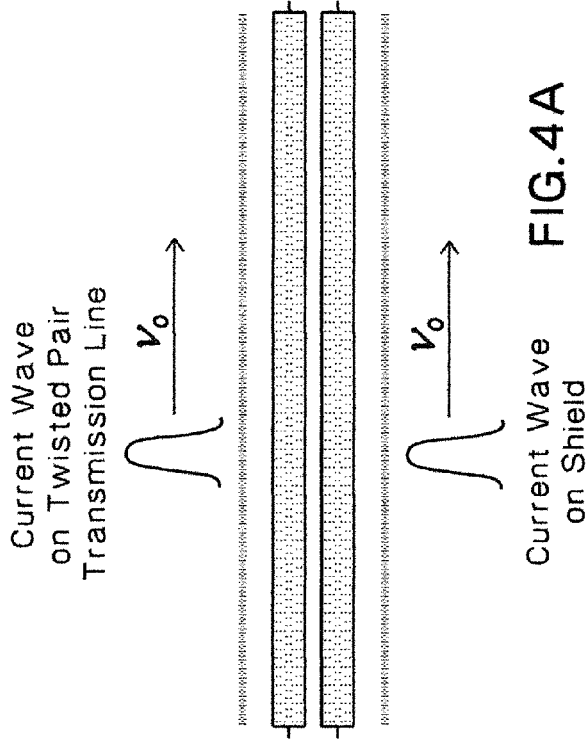
Figure 4C:
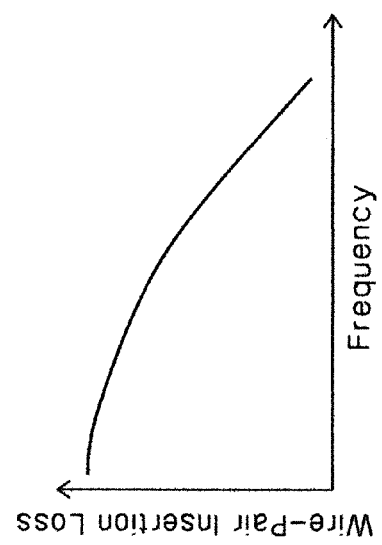
Figure 4D:
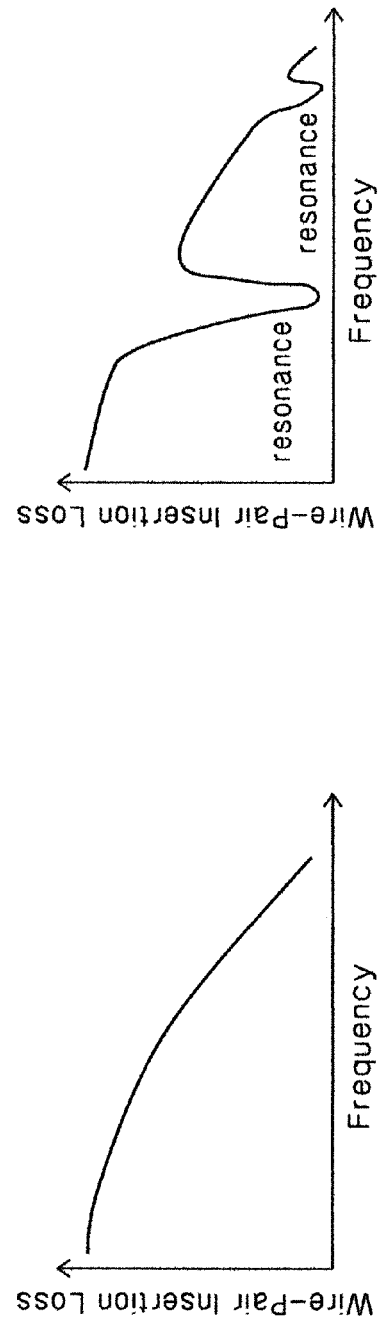
Figure 5A:
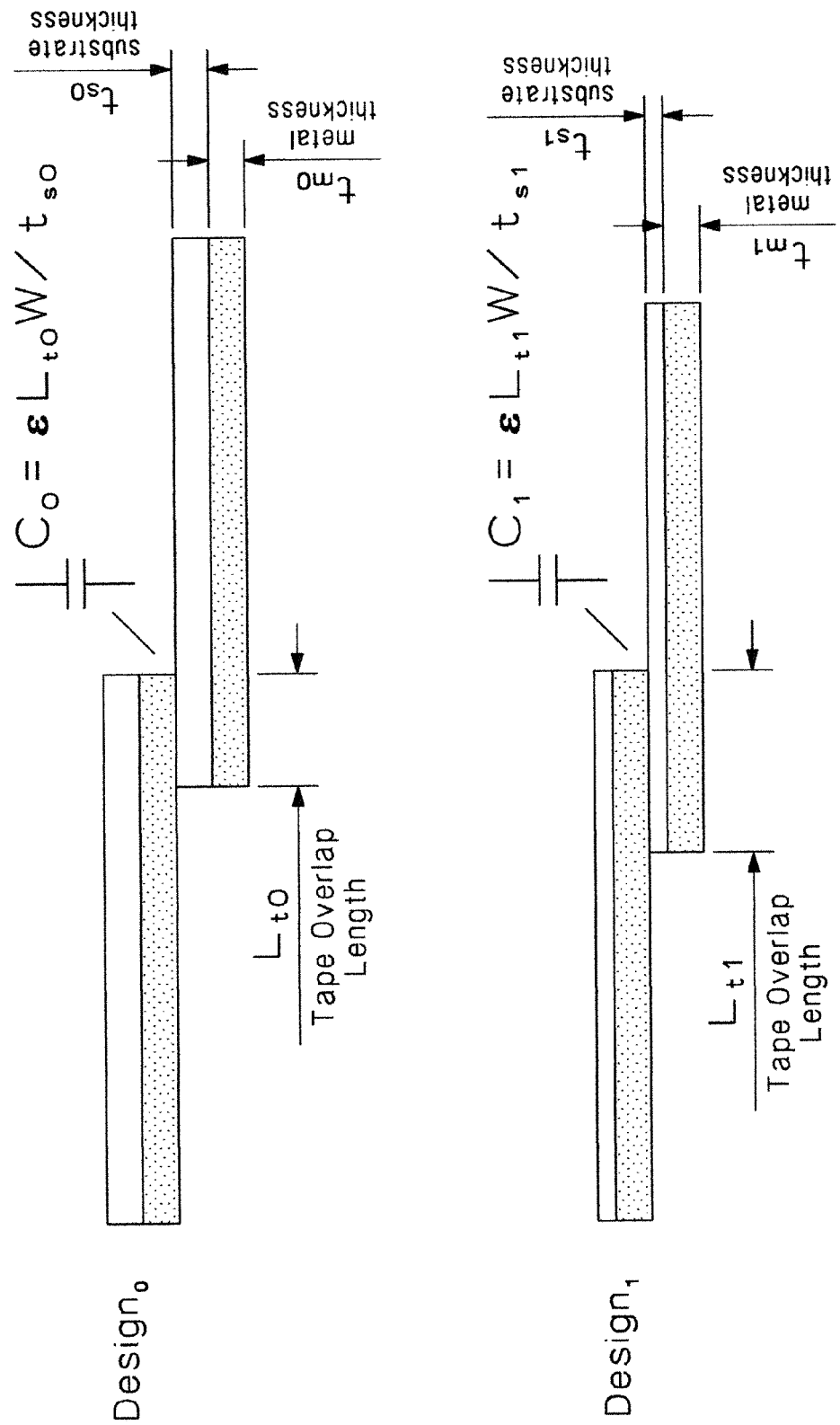
FIGS. 5A-D illustrate longitudinal cross-sections of spirally wrapped shields with varying longitudinal impedance.
Figure 5B:
Figure 5C:
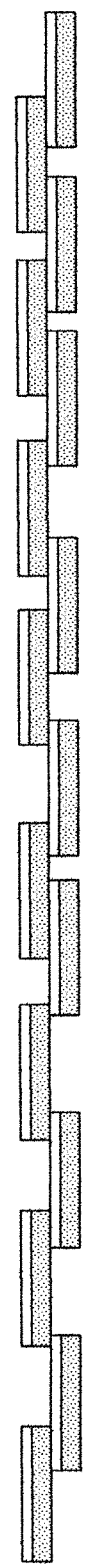
Figure 5D:
Figure 6A:
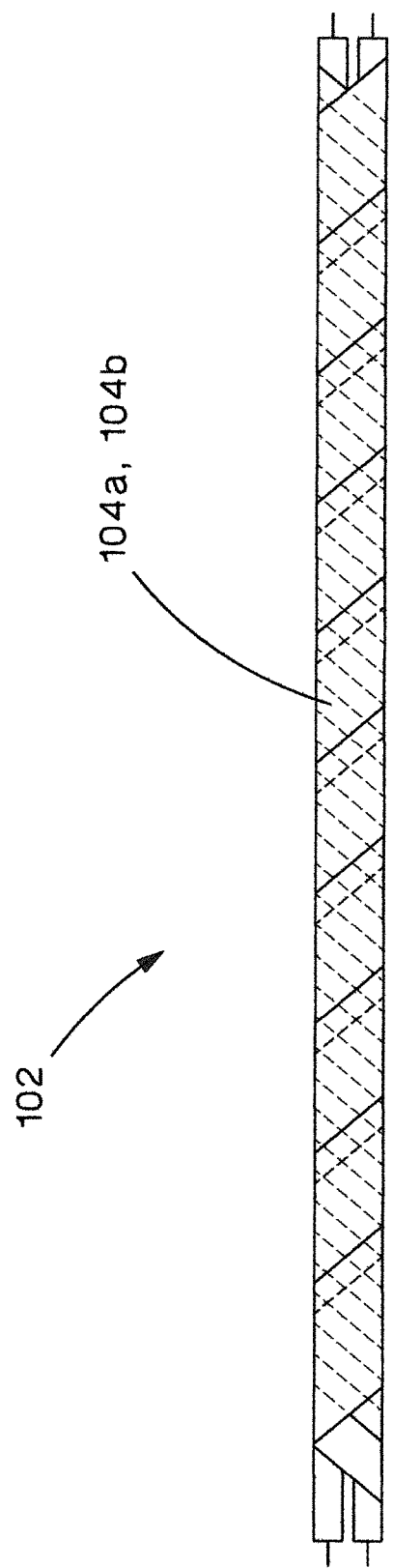
FIG. 6A illustrate a top view of a spirally wrapped twinax wire-pair with a double shield having improved resonance performance.
Figure 6B:
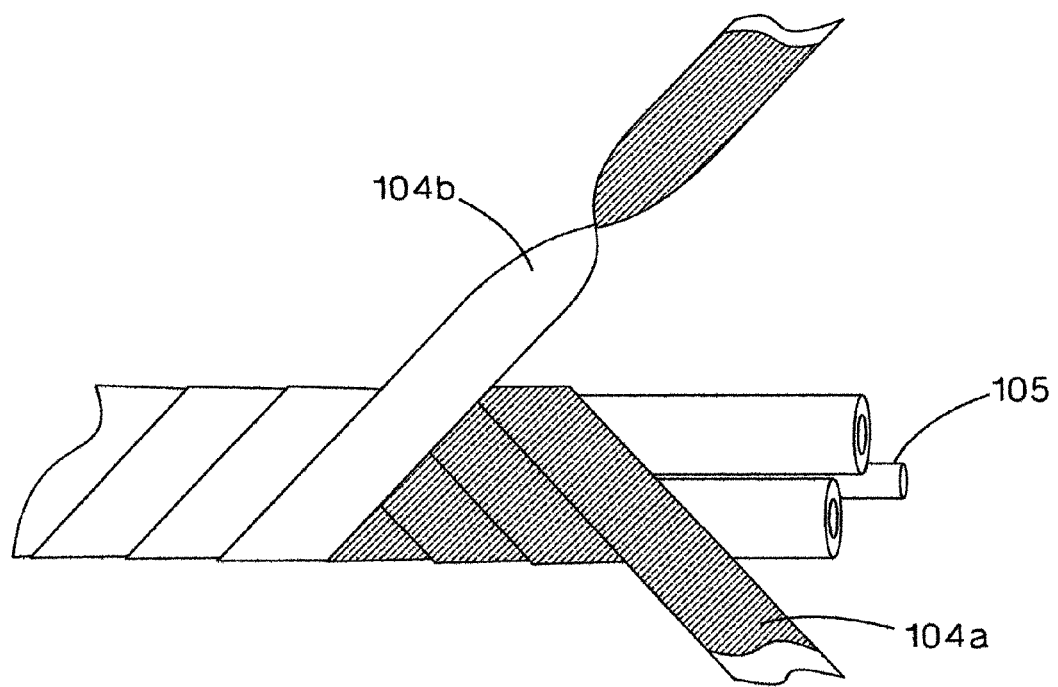
FIG. 6B is a perspective view of a spirally wrapped twinax wire-pair, similar to FIG. 6A, where the two shields have approximately equal widths.
Figure 6C:
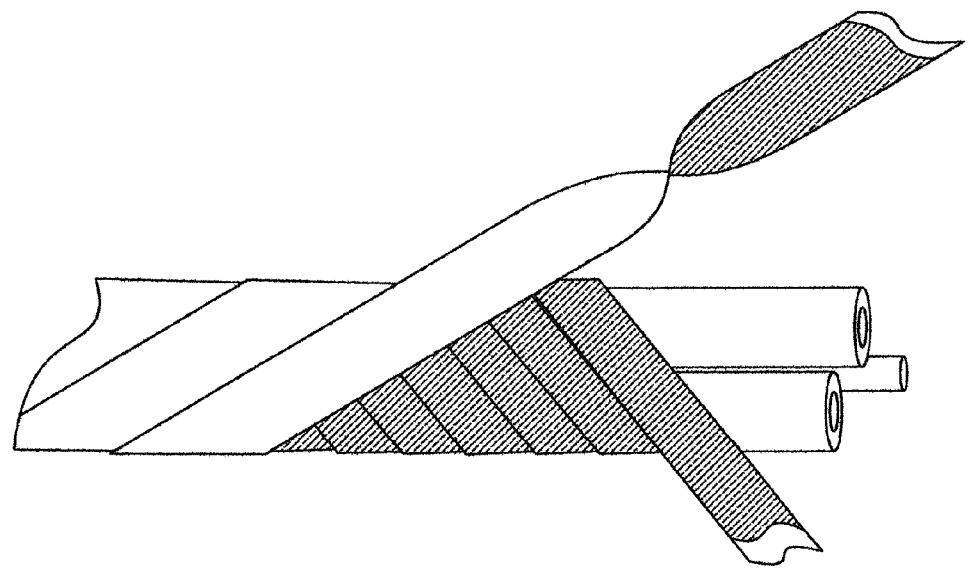
FIG. 6C is a perspective view of a spirally wrapped twinax wire-pair where the two shields have unequal widths.
Figure 6D:
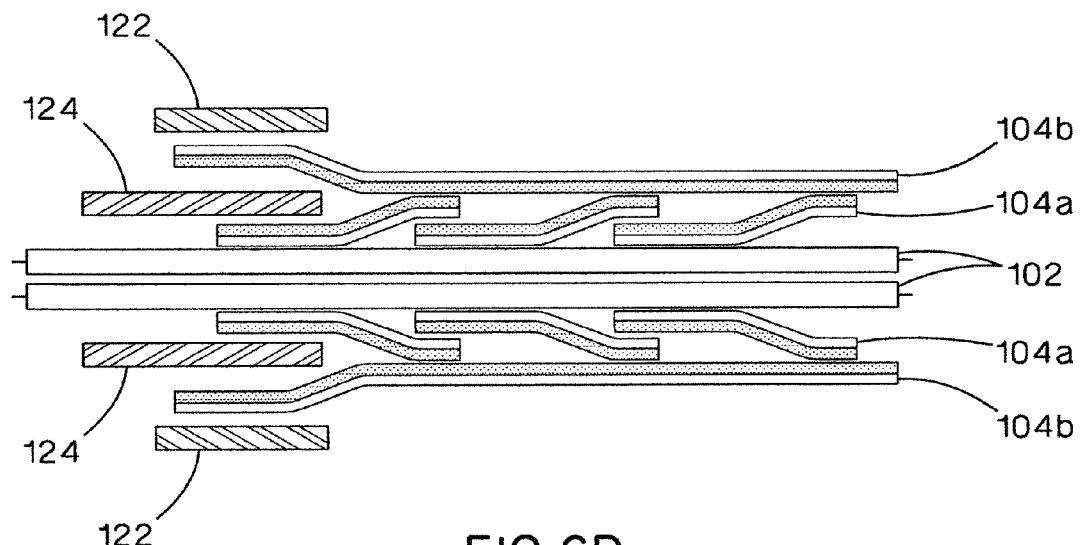
FIG. 6D is a longitudinal cross-sectional view of the wire-pair of FIG. 6A further illustrating how the wire-pair can be connected to a connector via crimp ferrules.
Figure 6E:
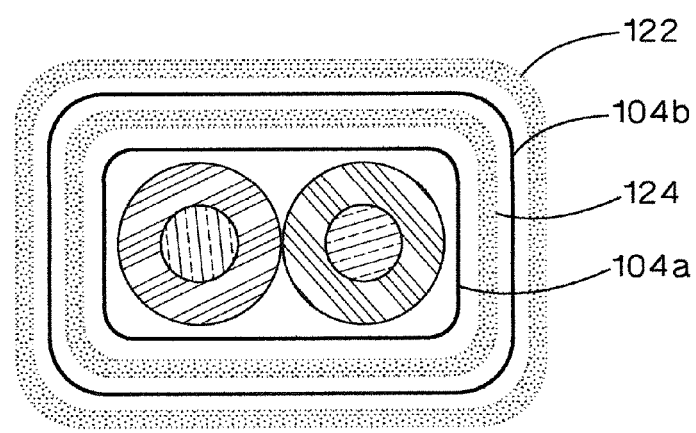
FIG. 6E is a cross-sectional view of the wire air of FIG. 6A further illustrating how the wire-pair can be connected to a connector via crimp ferrules.

FIGS. 6A-6E illustrate a proposed technique for reducing the shield resonance as well as improving the connection from the cable to the connector. If the shield tape overlap region can be effectively "short-circuited", the magnitude of the resonance is reduced. This particular technique includes double wrapping shield tapes 104a, 104b around the wire-pair 102 (shown in FIGS. 6A and 6B). The two tapes 104a, 104b can include a thin sheet of aluminum metal or other conductive material laminated upon an insulating substrate and have their metallic faces (crosshatched surfaces in FIGS. 6B and 6C) towards each other, which may eliminate the need for a drain wire. In this technique, the shield wraps 104a, 104b can have the same widths as shown in FIGS. 6A-6B, or different widths (FIG. 6C), and wound in alternative directions which improves the conductivity between the shield tapes 104a, 104b and hence minimizes the shield resonant magnitude. The longitudinal cross-sectional view shown in FIG. 6D, describes how the two shield tapes 104a, 104b connect/conduct between them, as well as how the cable can be connected to a connector via crimp ferrules 122, 124. The cross-sectional front view is shown in FIG. 6E. Although FIGS. 6B and 6C show a drain wire 105 which typically may be used as a signal ground or reference and is typically electrically conductive with tapes 104a, 104b, drain wire 105 may not be needed when using a pair manager as described below.

Figure 7D:
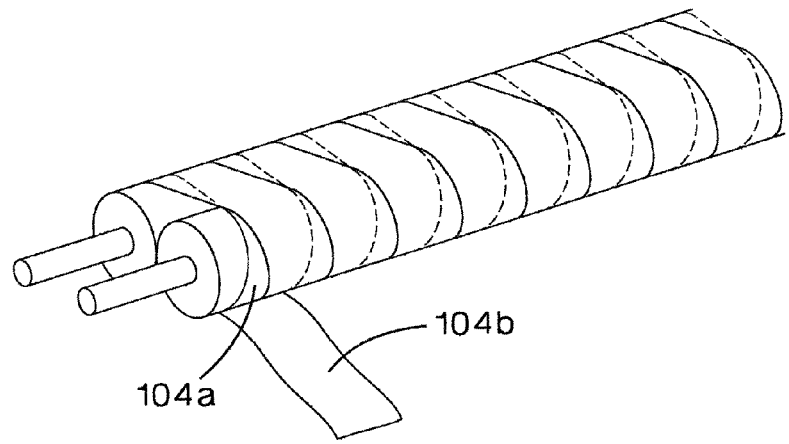
FIGS. 7D-7G are perspective views illustrating a method of terminating a double shielded twinax pair to a PCB using a pair manage.
Figure 7E:
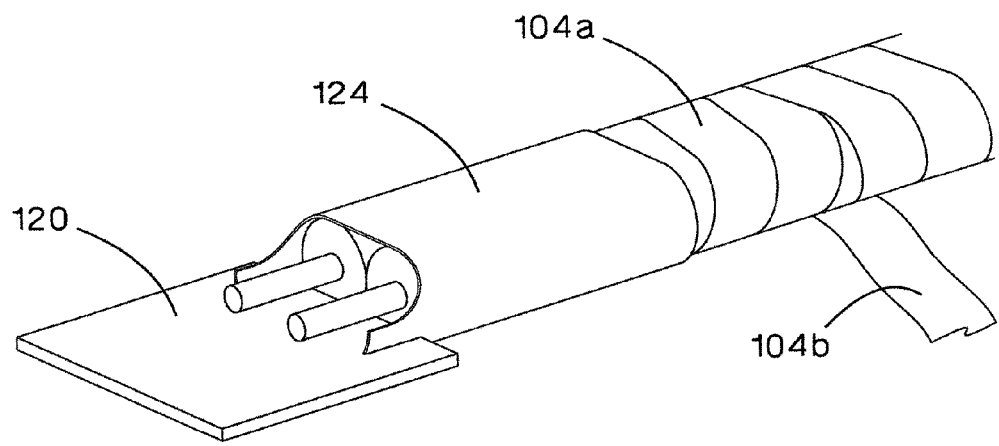
Figure 7F:
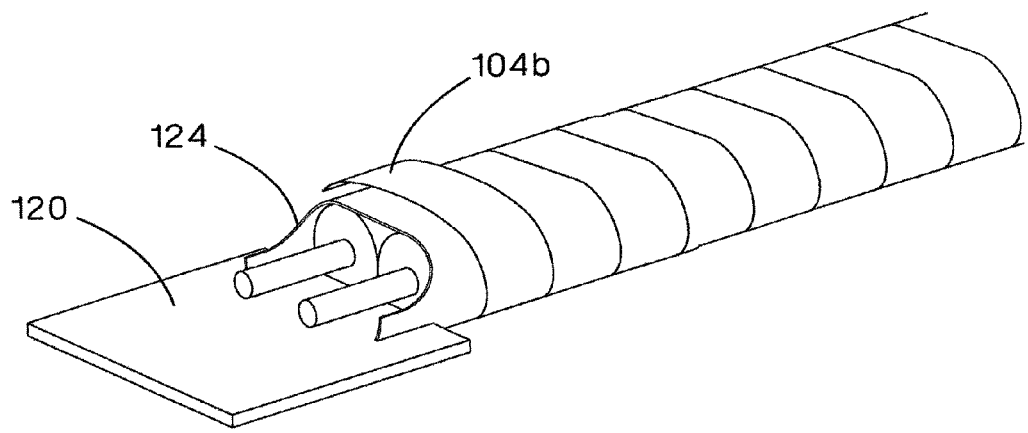
Figure 7G:
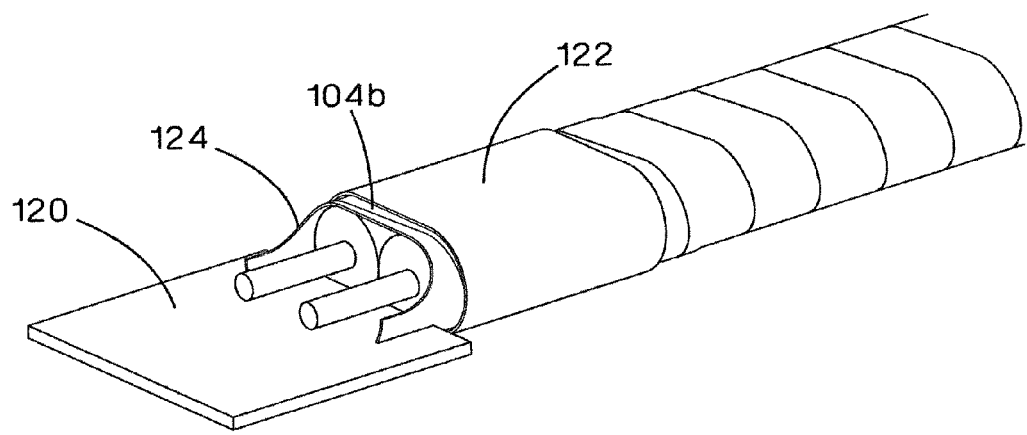

FIG. 7A shows a longitudinal cross sectional view of a twinax cable wire-pair 102 and a proposed connector interface to it. In FIG. 7A, an outer crimp ferrule 122 (an example of which is shown in more detail in FIG. 7C) is used to create a force acting on the outer shield 104b and to the inner crimp/support ferrule 124 (an example of which is shown in more detail in FIG. 7B) so that the outer shield 104b and the inner crimp/support ferrule 124 make a very low (360°) electrical resistive connection. The other end of the inner crimp/support 124 ferrule is used to make contact to the connector's circuit board 120 and keeping the impedance of the twinax cable wire-pair 102 as close to 100 ohm as possible. A "pair-manager" (at least ferrule 124, but can also include ferrule 122) is shown in FIG. 7A with at least a purpose of maintaining the characteristic impedance of the cable as it enters into the connector and to assist in mechanically aligning the twinax cable wire-pair 102 to the circuit board 120.

An example of the connector and circuit board 120 can be a SFP+ connector as shown in U.S. patent application Ser. No. 12/487,778 (Patel et al.), filed Jun. 19, 2009, incorporated by reference as if fully set forth herein. However, the present invention is not limited to such an application an can be used with other connector and cable types such as InfiniBand, QSFP, HDMI, CFP, CXP and other applications.

FIGS. 7D-7G are perspective views illustrating a method of terminating a double shielded twinax pair according to the present invention, particularly showing: unwrapping the outer shield 104b (FIG. 7D, outer ferrule 122 has already been slid over the outer shield 104b and back onto the twinax pair out of view); connecting the twinax pair to a PCB 120 using an inner ferrule 124 (FIG. 7E); rewrapping the outer shield 104b over the inner ferrule 124 (FIG. 7F); and sliding the outer ferrule 122 over the outer shield 104b and inner ferrule 124 where it can be crimped or otherwise bonded to the shield 104b and/or ferrule 124. Outer ferrule 122 can be crimped to electrically bond inner ferrule 124 to the conductive portions of shields 104a, 104b. Alternatively, inner ferrule 124 can be electrically bonded to the conductive portions of shields 104a, 104b by soldering, welding (ultrasonic or otherwise), using a conductive adhesive, or by other techniques, which may eliminate the need for outer ferrule 122. The pair manager and twinax cable according to the present invention provides a low impedance signal return path.

Inner ferrule 124 is typically connected to a ground pad, or in other words a signal return, on PCB 120. One advantage of the pair manager according to the present invention is that it can provide broadband improvement in differential return loss for the cable assembly due to more contact with the shield tapes 104a, 104b, in addition to providing termination to PCB 120 signal ground or reference, for the shield tapes 104a, 104b which tapes provide improved insertion loss characteristics for the cable/assembly according to the present invention.

In FIG. 7H, a cross-sectional side view is shown for a single twinax cable wire-pair. In FIG. 7I, two options are shown for connecting two wire-pairs 102 to the connector.

Figure 8A:
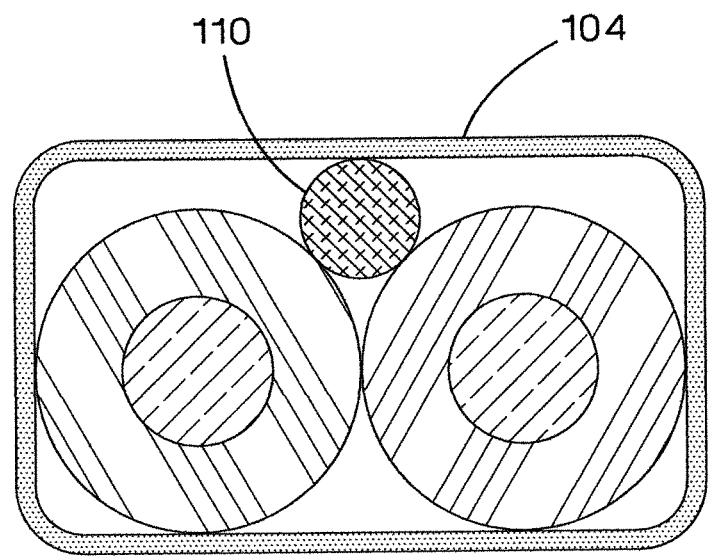
FIGS. 8A-D are transverse cross-sectional views of a twinax wire-pair illustrating various methods of installing a drain wire.
Figure 8B:
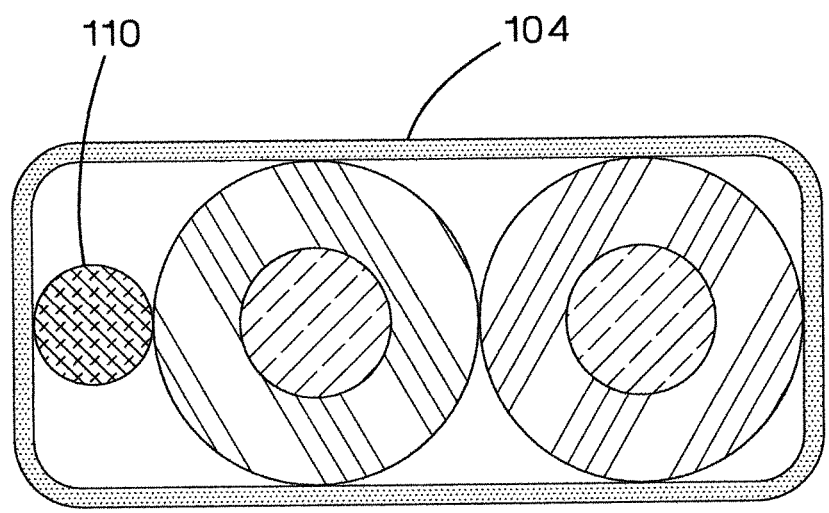
Figure 8C:
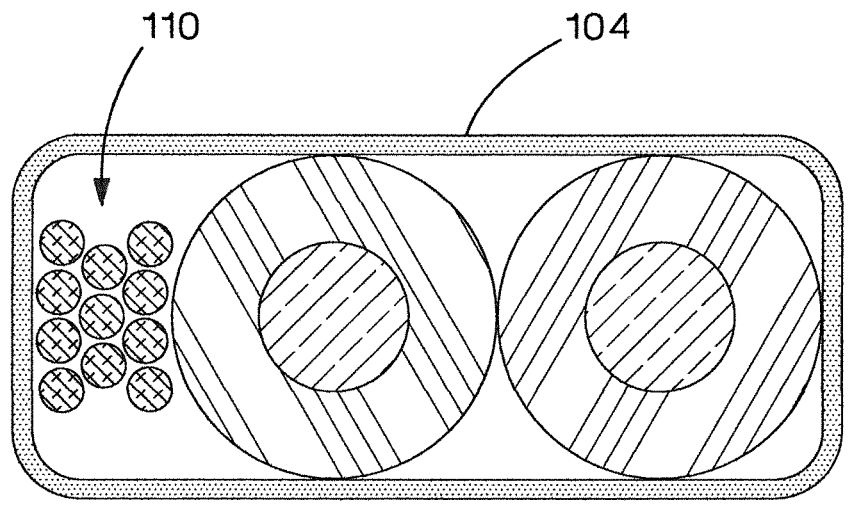
Figure 8D:
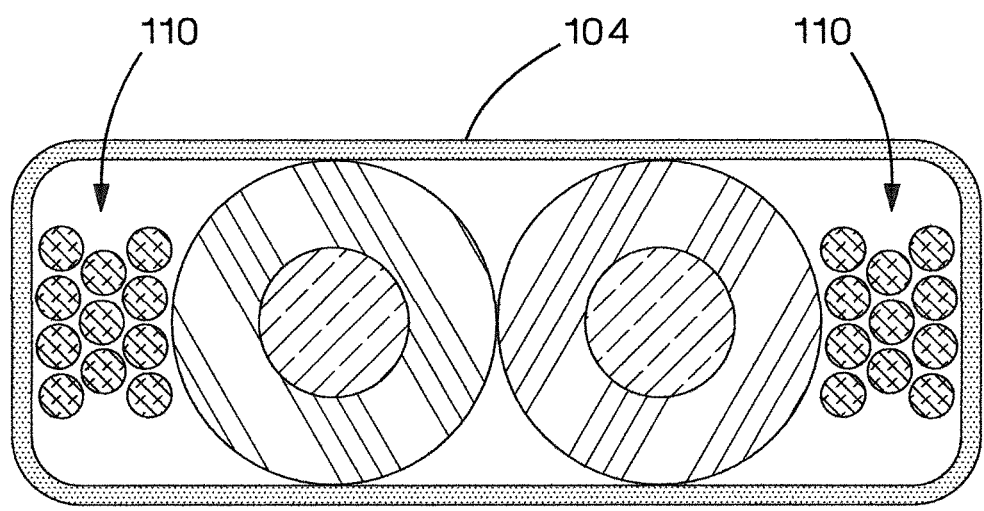

A cross-sectional view of a standard twinax cable wire par 102 is again shown in FIG. 8A, and some proposed methods to minimize the shield resonance by moving the drain wire 110 to the side as shown in FIG. 8B, or through the use of stranded wire as the drain wire 110 located to the side as shown in FIG. 8C or through the use of two stranded wires located to both sides as shown in FIG. 8D. Locating the drain wire 110 to the side increases the force on the wire and shield to improve the conductivity between them. Using stranded wire should improve the conductivity between the drain wire 110 and the shield 104 because the wire can deform to the shape that surrounds it making a better (lower resistance) contact.

Figure 9A:
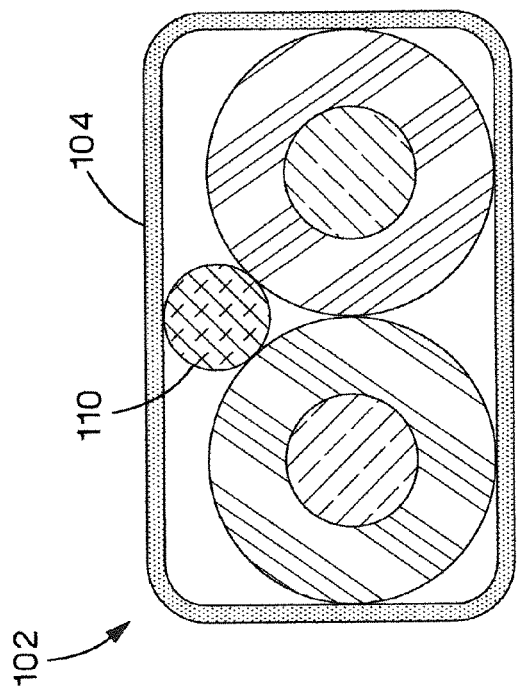
FIG. 9A is a transverse cross-sectional view of a twinax cable wire-pair.
Figure 9B:
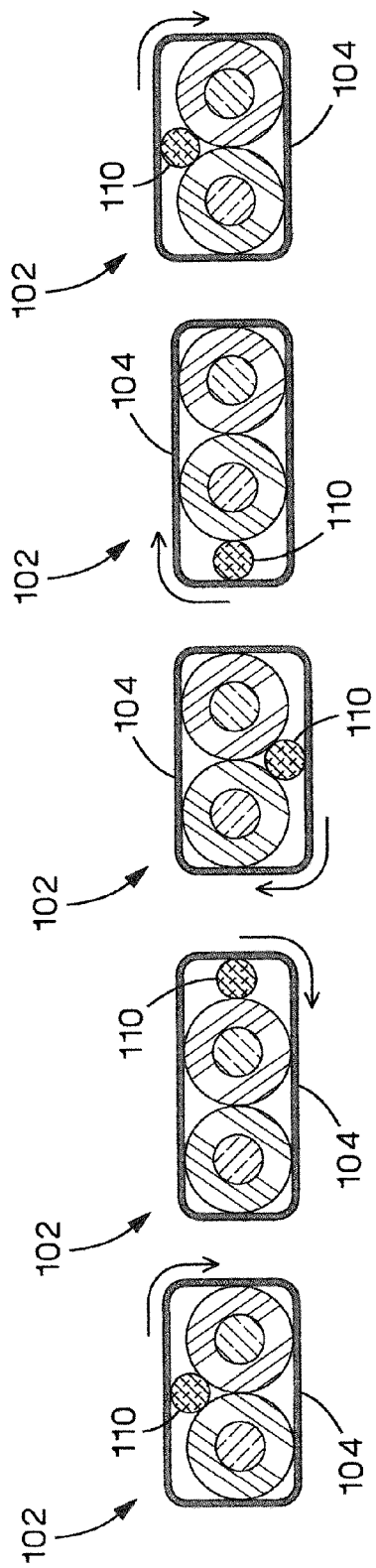
FIG. 9B is a cross-sectional views of a twinax cable wire-pair with a spirally wrapped drain wire.

FIGS. 9A and 9B show a way of ensuring a better method of contacting the shield to the drain wire. Here a cross sectional view of a twinax cable wire-pair 102 is again shown in FIG. 9A and a proposed method to minimize the shield resonance by spirally wrapping the drain wire 110 around the wire-pair FIG. 9B. Spiral wrapping the drain wire 110 improves the contact force that the shield tape 104 makes on the drain wire 110 and hence lowers the contact resistance.

Figure 10A:
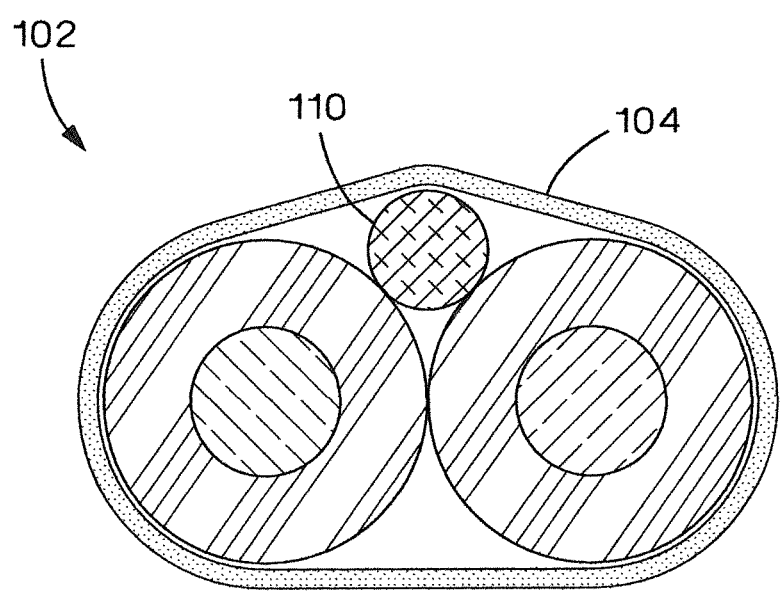
FIGS. 10A-C are a cross-sectional view of a twinax wire pair and corresponding schematic views illustrating the electro-magnetic field distribution between the wires of a twinax cable wire-pair.
Figure 10C:
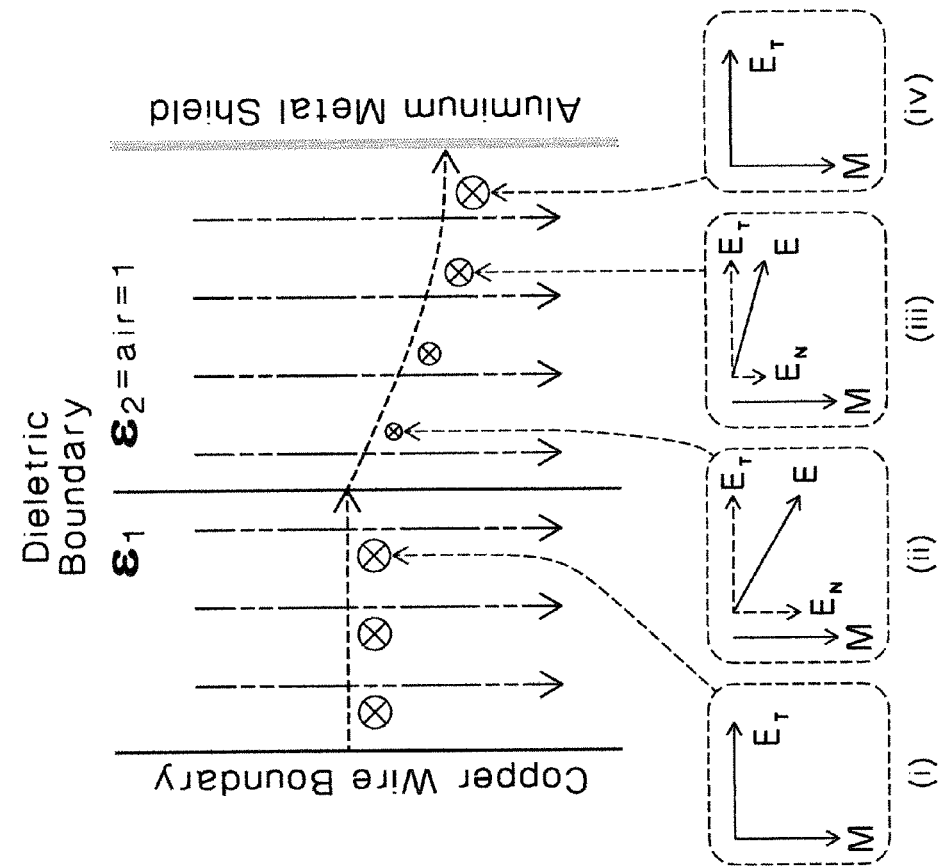
Figure 10B:
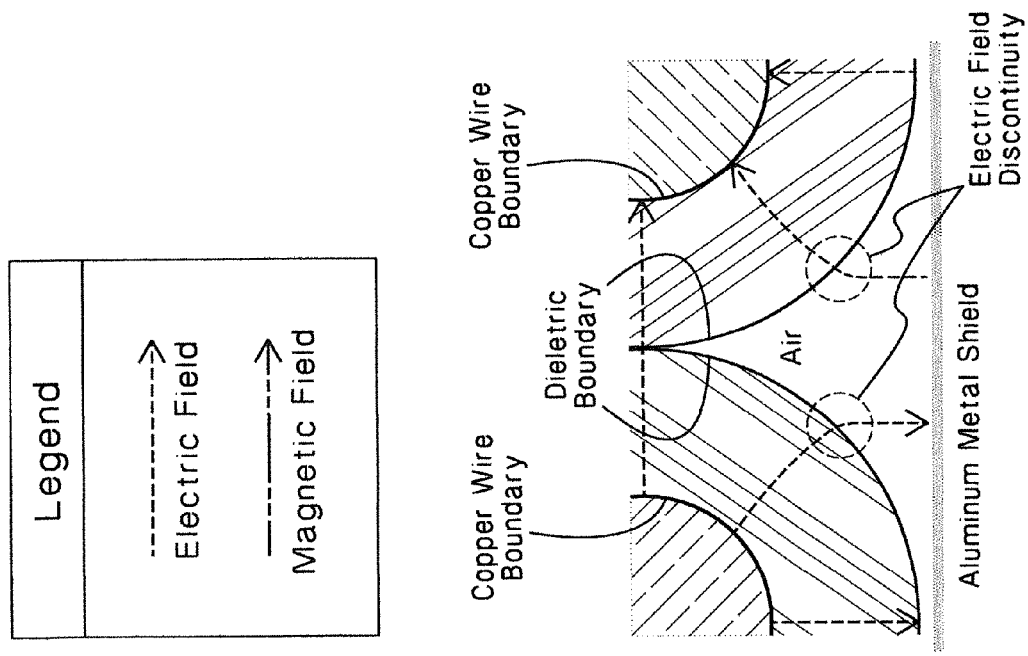

FIG. 10A is a cross-sectional view of a twinax cable wire pair 102 and the electro-magnetic field distribution is shown in FIGS. 10B and 10C. Due to the boundary conditions at the dielectric air interface, the electric field is distorted (see B). This distortion that occurs with the electric field and not with the magnetic field causes an increase of loss to occur within the cable. This is best understood by use of the diagram in FIG. 100. The guided energy within the electro-magnetic field is traveling longitudinally along the twinax cable as defined by Maxwell's equation. Here the EM field must be transverse so as to obtain a minimum loss wave guide. If the electric field distorts, some of the energy is lost due to the fields not being entirely transverse (this energy is converted to different propagating modes).

Figure 11A:
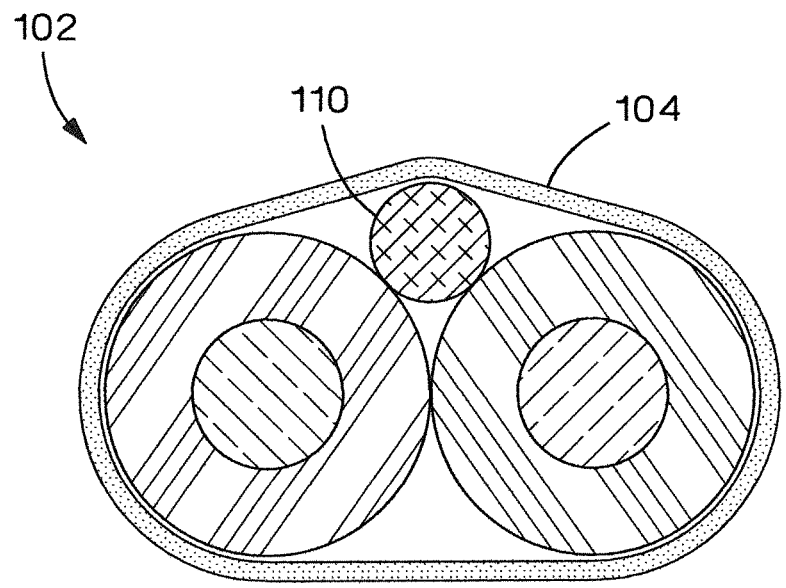
FIGS. 11A-D are transverse cross-sectional views of various twinax cable wire-pair constructions, particularly illustrating variations in shield, dielectric, and drain wire configurations.
Figure 11B:
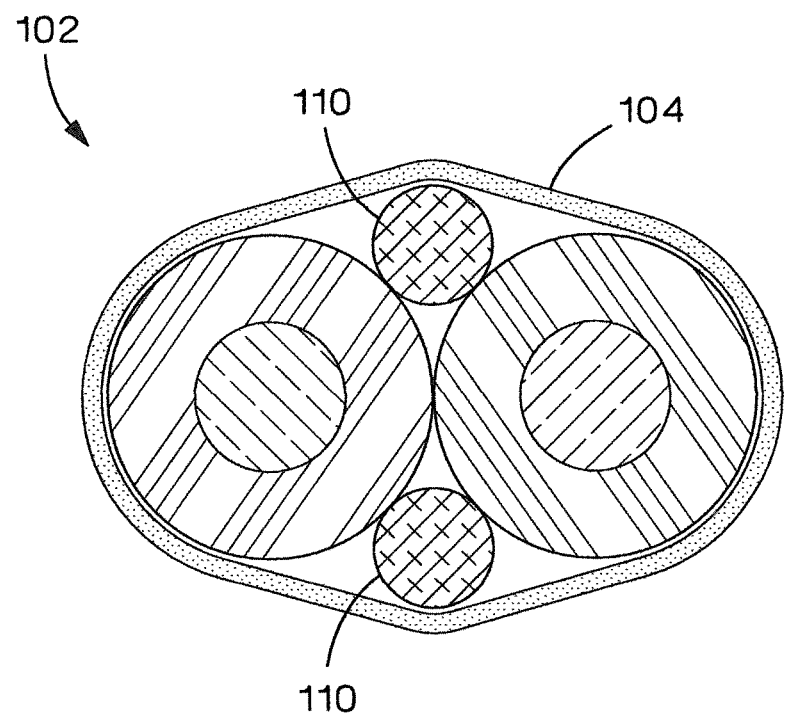
Figure 11C:
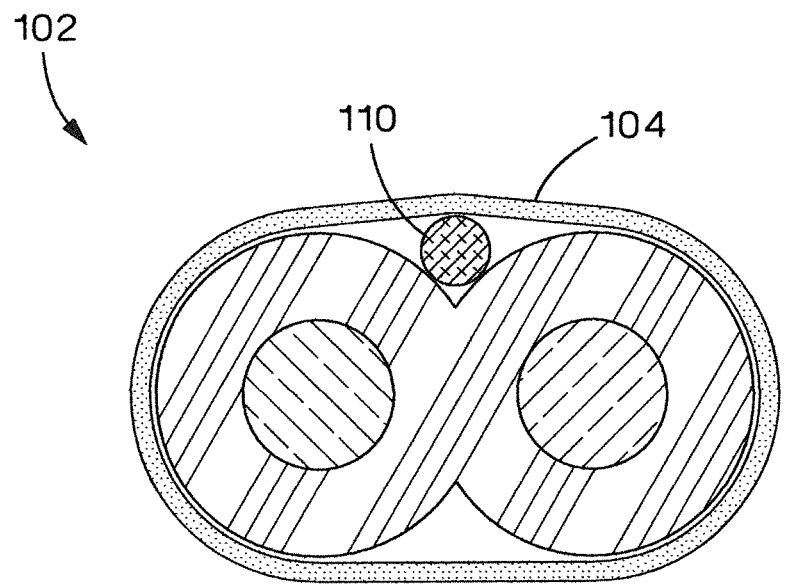
Figure 11D:
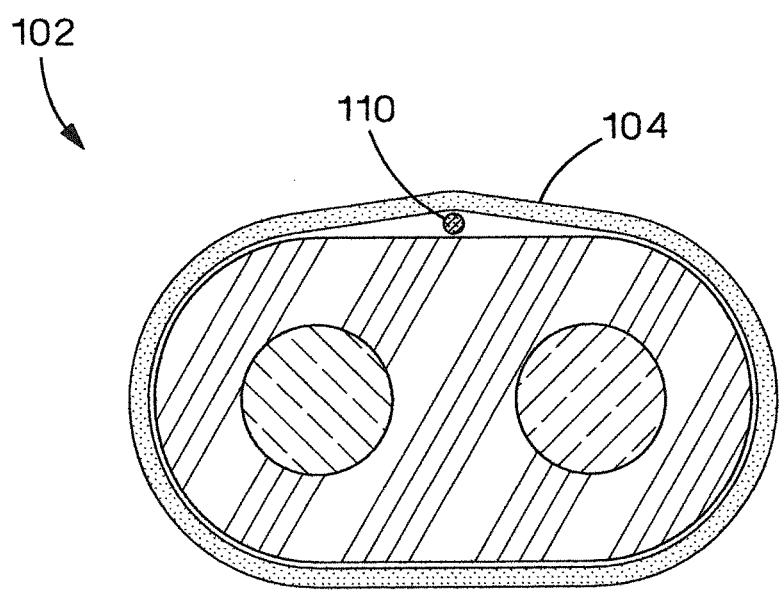

FIGS. 11A-11D illustrate cross-sectional views of various twinax cable wire-pair constructions. In FIG. 11A, a typical twinax cable wire-pair 102 where each wire is independently formed and is held together in close proximity by the shield tape 104 that surrounds it is shown. The problems with the embodiment of FIG. 11A include return loss (where the wires may move apart during cable flexures), and attenuation (where some of the energy within the electro-magnetic field is lost at the dielectric air boundary). Both the return loss and the attenuation can be improved through the use of an additional drain wire 110 as shown in FIG. 11B or either bonding the two wires together as shown in FIG. 11C or co-extruding the wires together as shown in FIG. 11D. In the embodiments of FIGS. 11B-D, the amount of energy lost due to electric field discontinuities is minimized. In the embodiments of FIGS. 11C and 11D, the return loss should be improved as long as the manufacturing process keeps the wire-pair's distance constant. Another technique is to begin with circular shaped wires with dielectric and squeeze two wires together which deforms the dielectric into more of a "D" shape.

Another technique of differential signal transmission with improved insertion loss is to utilize two 50Ω coax cables. Two signals (who have the same magnitude but 180° phase difference between them) are launched simultaneously into two different coax cables. In this technique, there is a reduction of insertion loss but maintaining a low skew between the two signals can be difficult due to variation in the two different coax cables.

For a SFP+ application, for example, the present invention can be used in a communication system that includes equipment such as switches, servers, and/or an active patch panel as is described in U.S. patent application Ser. No. 12/726,412 (Nordin et al.), filed Mar. 18, 2010, titled "Active Patch Panel," incorporated by reference as if fully set forth herein. The twinax cable can be used in a cable assembly according to the aforementioned Patel et al. '778 patent application, for example, to interconnect various equipment. The present invention can also be used in communication systems of other applications, such as InfiniBand, QSFP, HDMI, CFP, CXP and other applications employing twinax cable.

While particular embodiments and applications of the present invention have been illustrated and described, it is to be understood that the invention is not limited to the precise construction and compositions disclosed herein and that various modifications, changes, and variations may be apparent from the foregoing without departing from the spirit and scope of the invention as described.

What is claimed is:

1. A twinax cable comprising:
 a first twinax wire pair;
 a first shield tape wrapped around the first twinax wire pair, the first shield tape having at least one metallic side;
 a second shield tape wrapped around the first twinax wire pair and the first shield tape, the second shield tape having at least one metallic side wherein the at least one metallic side of the first shield tape faces and makes contact with the at least one metallic side of the second shield tape;
 and a drain wire, wherein the first and second shield tapes wrap around the drain wire as well as the first twinax wire pair, and wherein the first shield tape and second shield tape are wrapped in alternate directions.

2. The twinax cable of claim 1 wherein the first shield tape and second shield tape are different widths.

3. The twinax cable of claim 1 wherein the first shield tape and the second shield tape are the same width.

4. The twinax cable of claim 1 wherein the drain wire is located along a side of a first insulated conductor of the first twinax wire pair opposite a second conductor of the first twinax wire pair.

5. The twinax cable of claim 1 wherein the drain wire is spirally wrapped around the first twinax wire pair.

6. The twinax cable of claim 1 wherein the drain wire is composed of stranded wire.

7. The twinax cable of claim 1 further comprising:
 a second twinax wire pair;
 a third shield tape wrapped around the second twinax wire pair, the third shield tape having at least one metallic side; and
 a fourth shield tape wrapped around the second twinax wire pair, the fourth shield tape having at least one metallic side, wherein the at least one metallic side of the third shield tape faces and makes contact with the at least one metallic side of the fourth shield tape.

8. The twinax cable of claim 7 further comprising a fifth shield tape enclosing the first and second wire pairs.

9. The twinax cable of claim 8 further comprising a wire braid surrounding the fifth shield tape.

* * * * *